US007392498B1

(12) United States Patent
Srinivasan et al.

(10) Patent No.: US 7,392,498 B1
(45) Date of Patent: Jun. 24, 2008

(54) METHOD AND APPARATUS FOR IMPLEMENTING A PRE-IMPLEMENTED CIRCUIT DESIGN FOR A PROGRAMMABLE LOGIC DEVICE

(75) Inventors: Sankaranarayanan Srinivasan, Boulder, CO (US); W. Story Leavesley, III, Longmont, CO (US); George L. McHugh, Berthoud, CO (US); Douglas P. Wieland, Sunnyvale, CA (US); Sandor S. Kalman, III, Santa Clara, CA (US)

(73) Assignee: Xilinx, Inc, San Jose, CA (US)

( * ) Notice: Subject to any disclaimer, the term of this patent is extended or adjusted under 35 U.S.C. 154(b) by 320 days.

(21) Appl. No.: 10/993,887

(22) Filed: Nov. 19, 2004

(51) Int. Cl.
*G06F 17/50* (2006.01)
*H03K 19/00* (2006.01)

(52) U.S. Cl. .............................. 716/16; 716/17; 716/18

(58) Field of Classification Search .............. 716/16–18
See application file for complete search history.

(56) References Cited

U.S. PATENT DOCUMENTS

| 5,754,826 A * | 5/1998 | Gamal et al. ................. 703/14 |
| 6,401,230 B1 * | 6/2002 | Ahanessians et al. ........... 716/1 |
| 6,957,412 B1 * | 10/2005 | Betz et al. ...................... 716/16 |
| 6,971,083 B1 * | 11/2005 | Farrugia et al. ............... 716/17 |
| 7,117,471 B1 * | 10/2006 | Li et al. ........................ 716/12 |
| 7,131,096 B1 * | 10/2006 | Balsdon et al. ............... 716/13 |
| 2001/0047509 A1 * | 11/2001 | Mason et al. ................. 716/18 |
| 2004/0199879 A1 * | 10/2004 | Bradfield et al. ............... 716/1 |
| 2005/0097497 A1 * | 5/2005 | Schlansker et al. ........... 716/14 |
| 2005/0183054 A1 * | 8/2005 | Wein et al. .................... 716/11 |
| 2005/0183055 A1 * | 8/2005 | Herrera ........................ 716/17 |
| 2006/0001444 A1 * | 1/2006 | Chua et al. .................... 326/37 |

* cited by examiner

*Primary Examiner*—Stacy A Whitmore
*Assistant Examiner*—Magid Y Dimyan
(74) *Attorney, Agent, or Firm*—Robert Brush (57) ABSTRACT

Method and apparatus for implementing a pre-implemented circuit design for a programmable logic device is described. In one example, a definition of the pre-implemented circuit design is obtained (504). The definition includes a first physical implementation and a first logical implementation. A second logical implementation is produced (506) for an instance of the pre-implemented circuit design using the first logical implementation. A second physical implementation is produced (510, 512) for then instance of the pre-implemented circuit design using the first physical implementation.

19 Claims, 10 Drawing Sheets

PRIOR ART

METHOD AND APPARATUS FOR IMPLEMENTING A PRE-IMPLEMENTED CIRCUIT DESIGN FOR A PROGRAMMABLE LOGIC DEVICE

FIELD OF THE INVENTION

One or more aspects of the invention relate to programmable logic device design systems and, more particularly, to a method and apparatus for implementing a pre-implemented circuit design for a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

To implement a circuit design using an FPGA, the design is synthesized to produce a logical representation, which is then mapped onto programmable logic blocks, placed within the FPGA, and routed using the programmable fabric. The place and route phases of implementing a circuit design involve generating a layout of the circuit elements on the FPGA and defining the signal lines (routing resources) that connect the elements. The concept of reuse of design elements is gaining popularity in hardware design of digital circuits. Designers can implement and optimize a module and reuse it multiple times in their designs.

Accordingly, there exists a need in the art for a method and apparatus capable of implementing modules in a programmable logic device.

SUMMARY OF THE INVENTION

Method and apparatus for implementing a pre-implemented circuit design for a programmable logic device is described. In one embodiment, a definition of the pre-implemented circuit design is obtained. The definition includes a first physical implementation and a first logical implementation. A second logical implementation is produced for an instance of the pre-implemented circuit design using the first logical implementation. A second physical implementation is produced for the instance of the pre-implemented circuit design using the first physical implementation.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
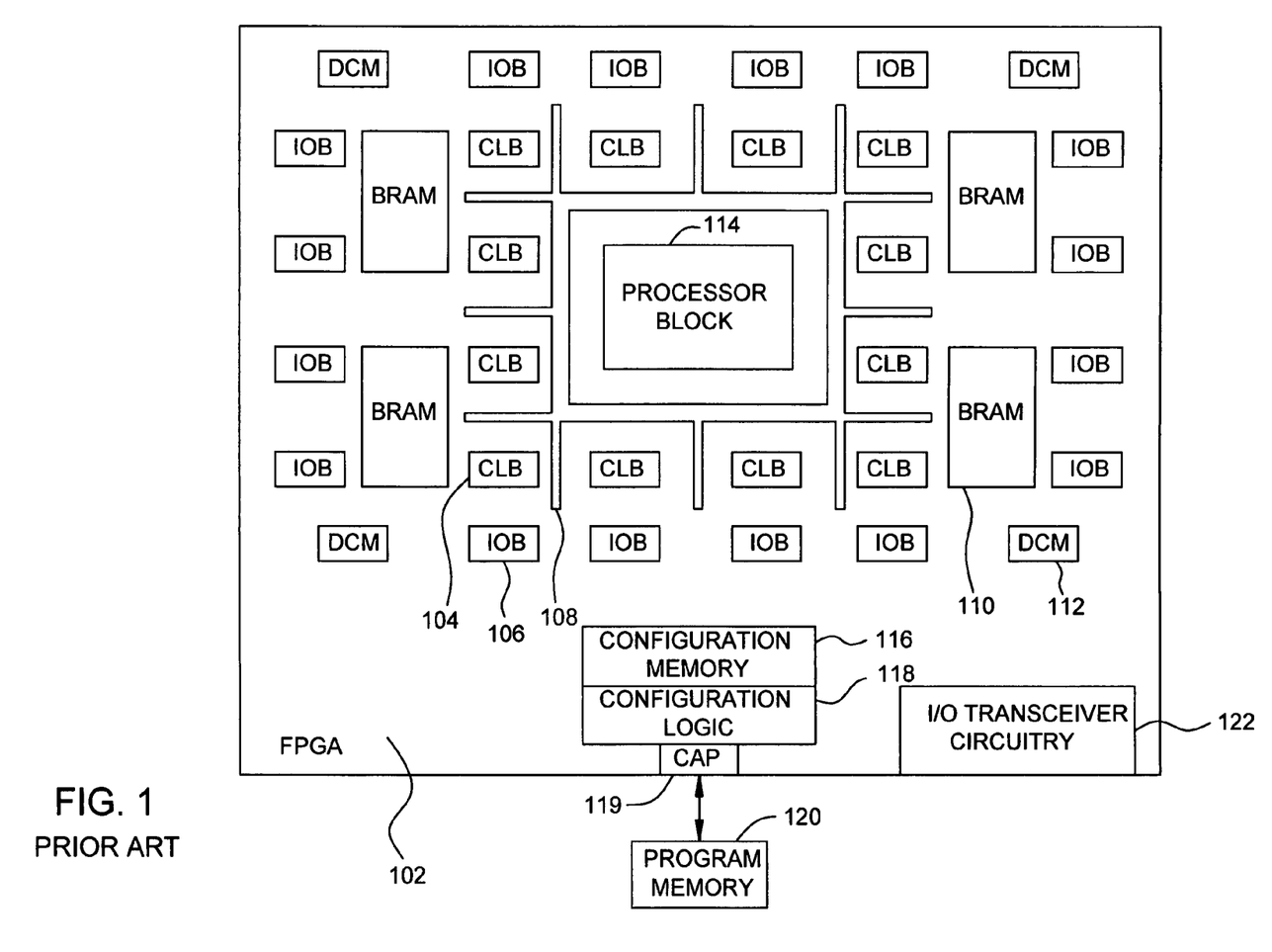
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

The I/O transceiver circuitry 122 may be configured for communication over any of a variety of media, such as wired, wireless, and photonic, whether analog or digital. The I/O transceiver circuitry 122 may comprise gigabit or multi-gigabit transceivers (MGTs). The DCM blocks 112 provide well-known clock management circuits for managing clock signals within the FPGA 102, such as delay lock loop (DLL) circuits and multiply/divide/de-skew clock circuits.

The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-II PRO family of products, commercially available from Xilinx, Inc. of San Jose, Calif.

Figure 2:
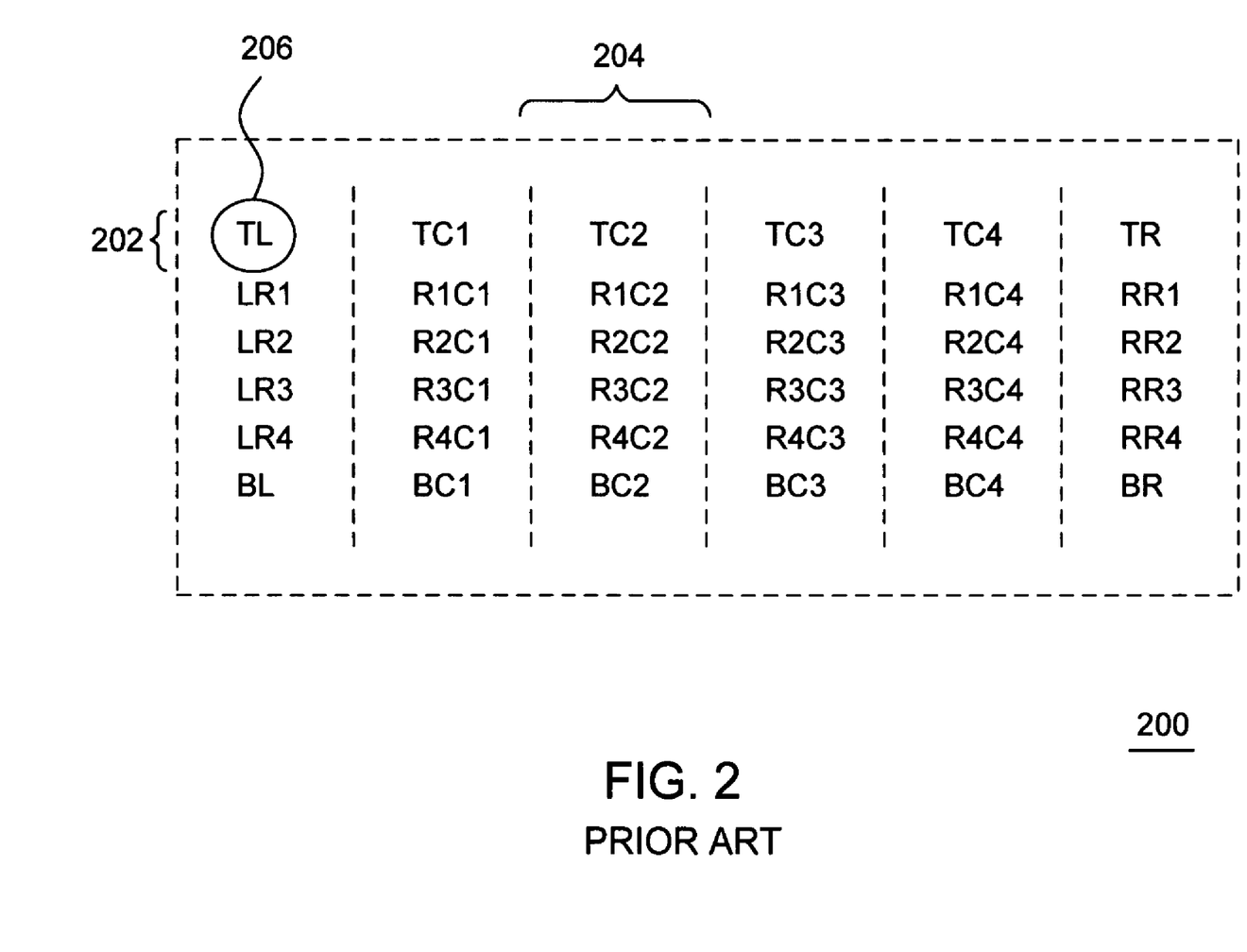
FIG. 2 depicts an exemplary layout for an FPGA.

The physical layout of the FPGA 102 may be organized into "tiles". Notably, FIG. 2 depicts an exemplary layout 200 for an FPGA. In the present example, the layout 2000 includes a 6×6 array of tiles organized into rows 202 and columns 204. A tile 206 includes a set of logic elements and associated routing resources. For example, in the VIRTEX-II architecture, a tile-type known as CENTER includes four CLBs, two three-state buffers (TBUFs), and associated signal conductors (wires). Tiles 206 in the layout 200 may include other types of FPGA logic, such as BRAM, IOBs, multipliers, and the like.

Tiles 206 are identified by a unique type (e.g., CENTER), row 202, and column 204 in the layout 200. In FIG. 2, "T" refers to top, "B" refers to bottom, "L" refers to left, "R" refers to right, "Rn" refers to the nth row 202 (not including the topmost and the bottommost of the rows 202), and "Cn" refers to the nth column 204 (not including the leftmost and the rightmost of the columns 204). For example, a tile 206 in the top-left of the layout 200 is identified as "TL". A tile 206 on the right edge in the first row is identified as "RR1".

Similar wires (interconnect) in similar tile types are equivalent in terms of their electrical characteristics. For example, the programmable interconnect of an FPGA may include routing resources (wires) that connect adjacent CLBs, that span two CLBs ("double lines"), that span six CLBs ("hex lines"), and that span the entire device ("long lines"). Double lines in one CENTER tile type have equivalent electrical characteristics as double lines in another CENTER tile type. As described below, the present invention takes advantage of this tile-wire similarity to re-locate a pre-implemented circuit design within a target FPGA device. For purposes of clarity, the layout 200 is shown with regularity. It is to be understood, however, that commercial FPGAs typically include irregular layouts (i.e., the tiles are not in a regular matrix layout).

Figure 3:
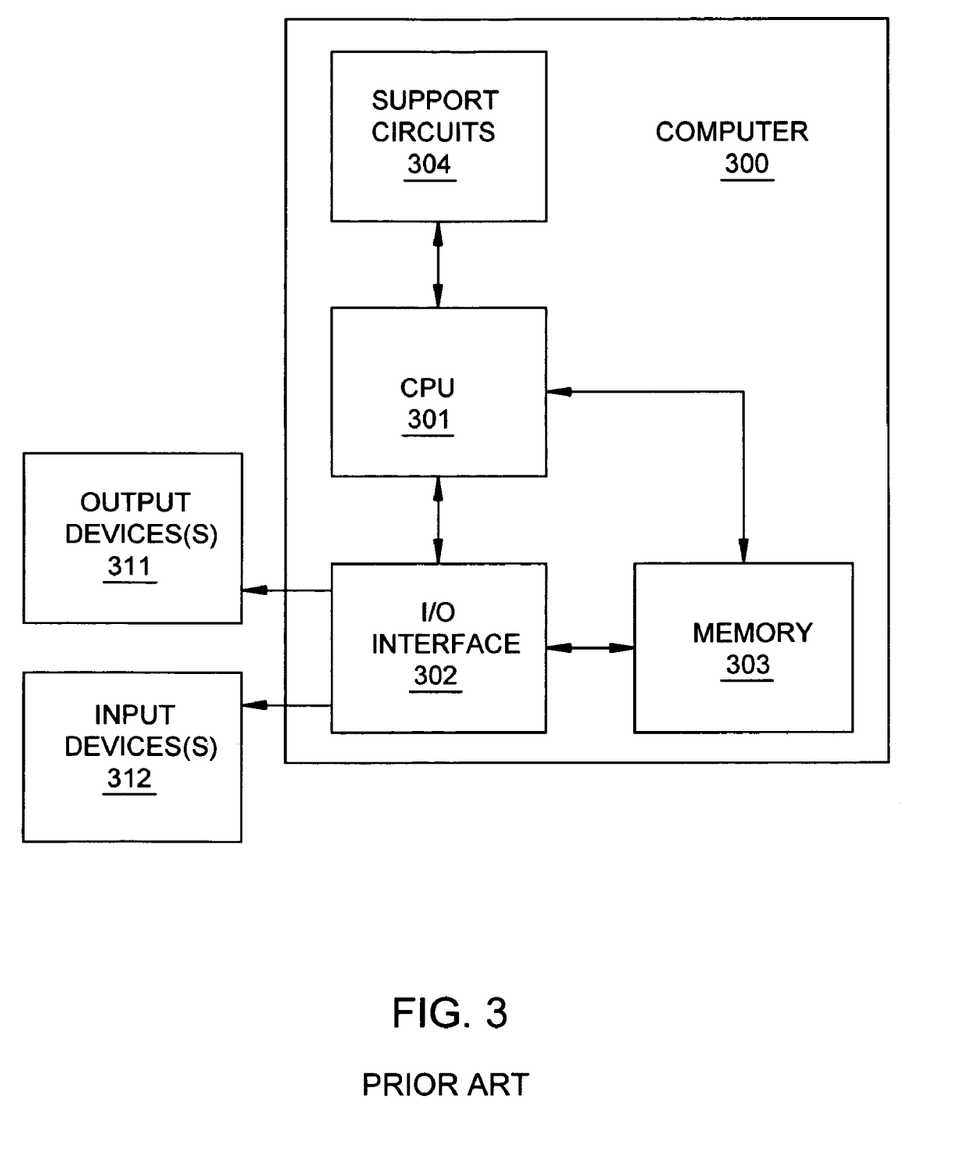
FIG. 3 is a block diagram depicting an exemplary embodiment of a computer suitable for implementing the processes and methods described herein.

FIG. 3 is a block diagram depicting an exemplary embodiment of a computer 300 suitable for implementing the processes and methods described herein. The computer 300 includes a central processing unit (CPU) 301, a memory 303, various support circuits 304, and an I/O interface 302. The CPU 301 may be any type of microprocessor known in the art. The support circuits 304 for the CPU 301 include conventional cache, power supplies, clock circuits, data registers, I/O interfaces, and the like. The I/O interface 302 may be directly coupled to the memory 303 or coupled through the CPU 301. The I/O interface 302 may be coupled to various input devices 312 and output devices 311, such as a conventional keyboard, mouse, printer, display, and the like.

The memory 303 may store all or portions of one or more programs and/or data to implement the processes, methods, and design tools described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 300 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 303. The memory 303 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 4:
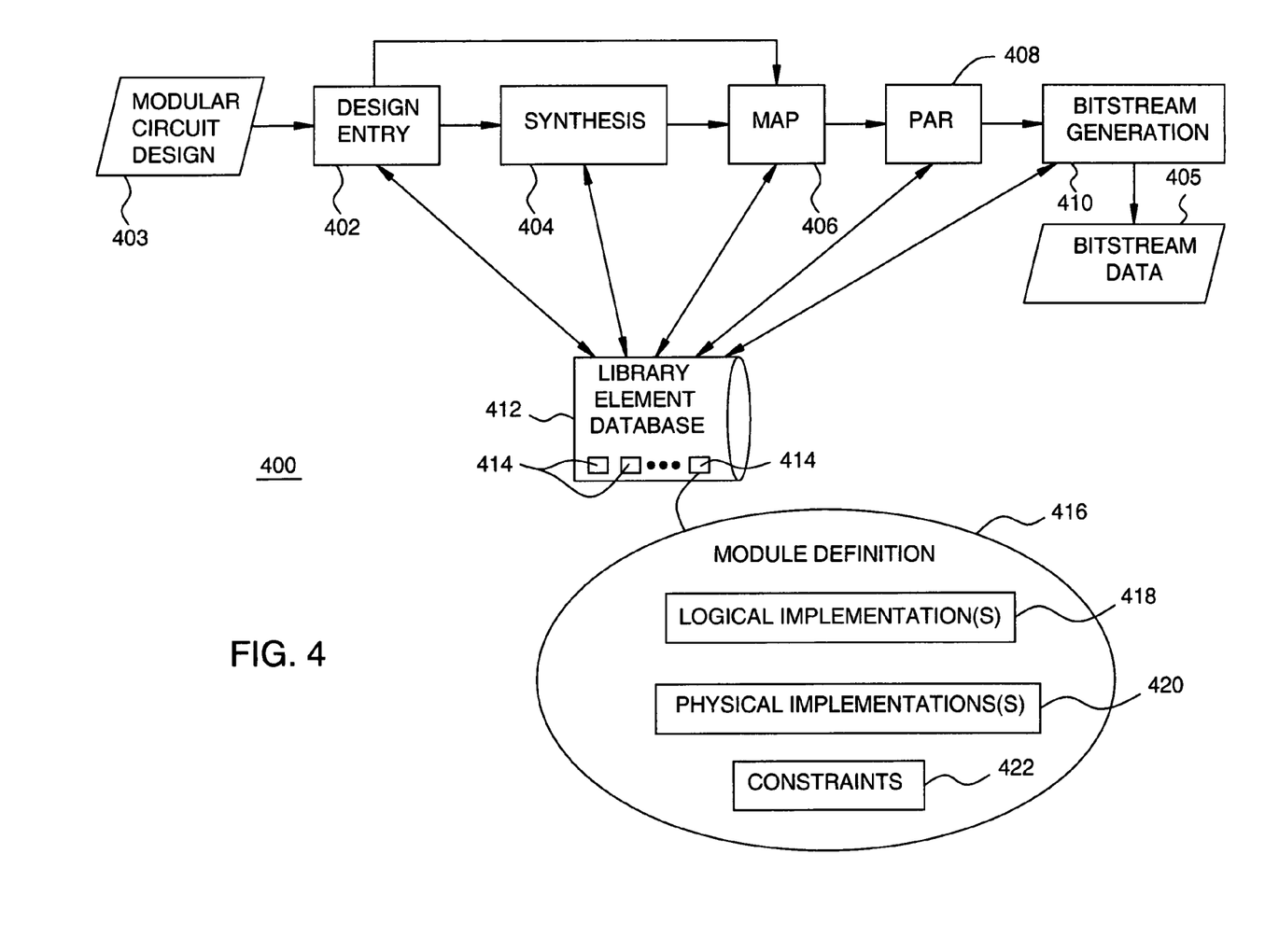
FIG. 4 is a block diagram depicting an exemplary embodiment of a design system for programmable logic devices (PLDs) in accordance with the invention.

FIG. 4 is a block diagram depicting an exemplary embodiment of a design system 400 for programmable logic devices (PLDs) in accordance with the invention. The design system 400 includes a design entry tool 402, a synthesis tool 404, a map tool 406, a place-and-route (PAR) tool 408, a bitstream generation tool 410, and a database of library elements ("database 412"). Each of the tools 402 through 410 has access to the database 412. The design system 400 may be implemented using the computer 300 shown in FIG. 3. Notably, the tools may be part of one or more software programs stored in the memory 303 and configured for execution by the CPU 301.

The design system 400 is configured to generate bitstream data 405 for a target FPGA device in response to a circuit design input by a user ("modular circuit design 403"). In particular, the design entry tool 402 is configured to receive user input and generate a functional description of the modular circuit design 403. The modular circuit design 403 includes a plurality of circuit elements, such as flip-flops, memories, LUTs, and the like, connected together via signal conductors ("nets" or "signals"). The term "elements" as used herein is meant to encompass both circuit elements and nets/signals.

The design entry tool 402 may include a graphic interface through which a designer connects symbols and blocks representing various components to produce a schematic description of the circuit design. The design entry tool 402 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

In one embodiment, the synthesis tool 404 is configured to receive functional design data from the design entry tool 402. The synthesis tool 404 processes the functional design data to produce logical design data (i.e., a logical representation of the modular circuit design 403). The logical design data may include a logical network list ("netlist") supported by the target FPGA. For example, the synthesis tool 404 may process HDL code of the functional design data to produce a netlist. The HDL synthesis process is well known in the art. In another embodiment, the design entry tool 402 produces the logical design data directly. For example, the design entry tool 402 may produce a netlist for the target FPGA in response to a schematic description entered by the user.

The map tool 406 is configured to receive logical design data (e.g., netlist) from either the design entry tool 402 or the synthesis toll 404. The map tool 406 maps the logical design data onto primitive components within the target FPGA (i.e., the blocks and signals of the modular circuit design 403 are mapped onto CLBs, IOBs, etc. of the target FPGA).

The PAR tool 408 is configured to receive mapped design data from the map tool 406. The PAR tool 408 places the primitive components within the target FPGA and routes interconnects (e.g., signal conductors of the programmable interconnect) for the placed components. The PAR tool 408 produces physical design data for the target FPGA (i.e., a physical representation of the modular circuit design 403 for the target FPGA). The bitstream generation tool 410 is configured to receive physical design data from the PAR tool 408. The bitstream generation tool 410 processes the physical design data to produce the bitstream data 405 for the target FPGA. The bitstream data 405 may used to configure the FPGA with the modular circuit design 403.

One or more portions of the modular circuit design 403 may be designed using reusable modular circuits ("modules"). A module is a pre-implemented circuit design that is optimized for several criteria, such as optimal placement in terms of area and optimal routing in terms of delays between critical paths and timing performance. The module is pre-implemented in that the elements of the module (blocks and signals) are physically implemented using particular resources in a target device in isolation from a design that incorporates the module. The resources are defined by a location in the layout of the device (e.g., tile locations and tile-types) and programmed interconnect (e.g., wires and switches used within the tiles for signal routes).

Notably, the database 412 stores a set of library elements 414, where each library element 414 includes a module definition 416. The module definition 416 comprises one or more logical implementations 418, one or more physical implementations 420, and constraints 422. A logical implementation 418 may comprise a netlist that logically describes the module. In one embodiment, a physical implementation 420 includes a mapped, placed, and routed logical implementation 418 for a target FPGA device. In another embodiment, a physical implementation 420 may include a bitstream for a target FPGA device associated with a logical implementation The constraints 422 may include various constraints on the implemented module, such as timing constraints (which give rise to routing and placement constraints), power constraints, and the like.

A given module may be "instantiated" one or more times in the modular circuit design 403 using a corresponding module definition 416. An instantiated module is referred to herein as a "module instance" to differentiate from the module definition. The design entry tool 402, the synthesis tool 404, and the map tool 406 may use a logical implementation 418 from a module definition 416 to incorporate a module into the modular circuit design 403 thereby defining a module instance. The PAR tool 408 and the bitstream generation tool 410 may use a physical implementation 420 from a module definition 416 to implement the module instance for a target FPGA.

In particular, a module instance is implemented by re-implementing the corresponding module definition. In some cases, re-implementing the module definition requires the use of different resources in the target device than were used during the pre-implementation of the module definition. In other words, the module definition is re-located within the device to define the module instance. In other cases, the module instance may be implemented using the exact resources used for the module definition. For example, the modular circuit design 403 may only include one instance of a given module definition and the resources associated with the module definition may be available for use in implementing the module instance. The module definition must be re-located, however, if the original resources used are unavailable or if the modular circuit design 403 includes multiple instances of the same module definition. Exemplary processes for re-locating a module definition are described below.

A module definition 416 may include multiple logical and physical implementations. The different implementations may be optimized for different criteria, such as area, speed, power, and the like. A module instance may be implemented using the appropriate logical/physical implementation based on user requirements. For example, a given module definition (e.g., a peripheral component interface (PCI) core) may include one logical implementation 418 and multiple physical implementations 420 that depend on the orientation of the implementation in a target FPGA device. One physical implementation 420 may relate to the bottom of the target FPGA device (e.g., tiles at or near the bottom of the device layout), whereas another physical implementation may relate to the right edge of the FPGA device (e.g., tiles at or near the right edge of the device layout). In another embodiment, a module definition 416 may include multiple logical/physical implementations for multiple target devices (e.g., different types of FPGAS).

Figure 5:
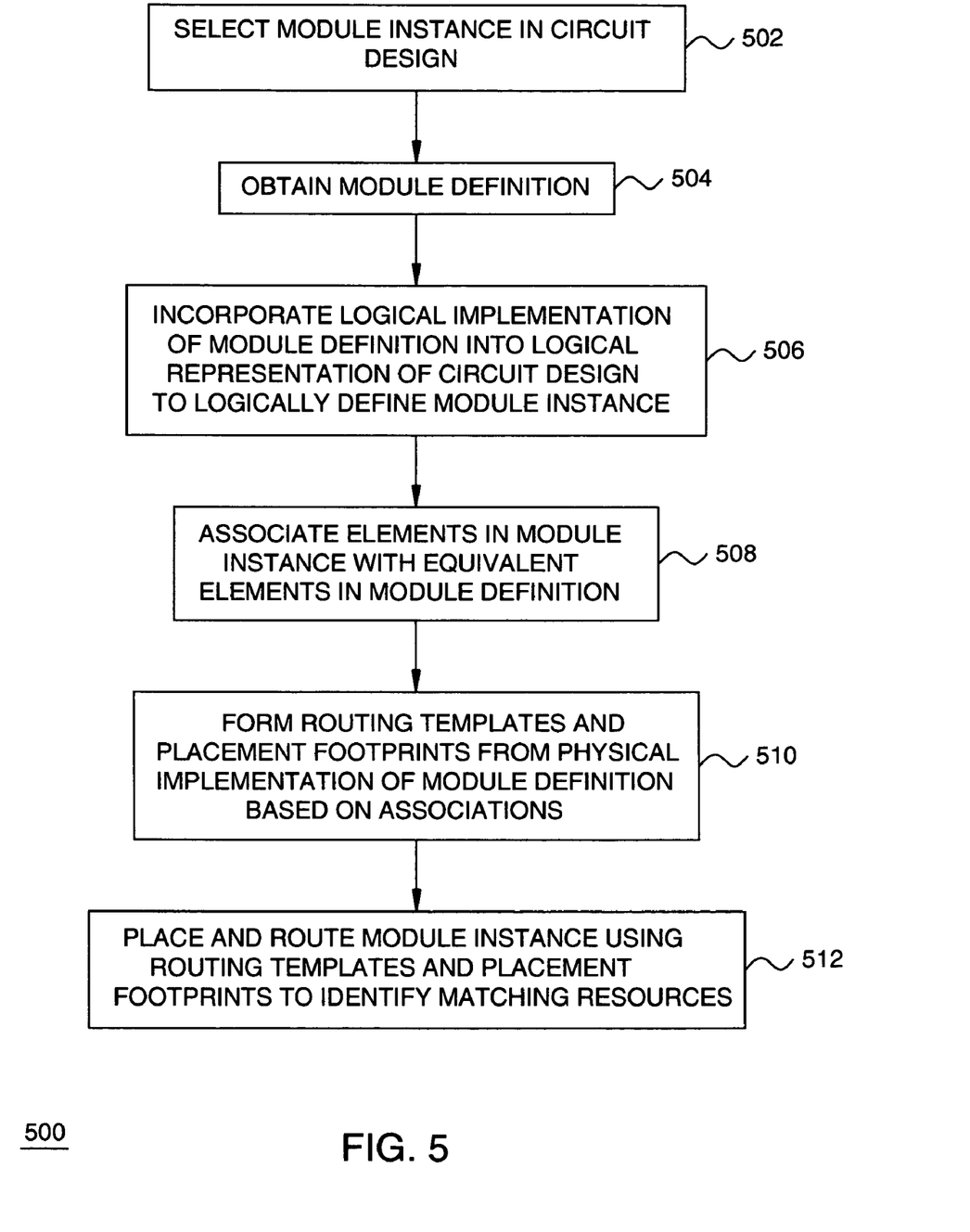
FIG. 5 is a flow diagram depicting an exemplary embodiment of a method for implementing a modular circuit design in accordance with the invention.

FIG. 5 is a flow diagram depicting an exemplary embodiment of a method 500 for implementing a module definition in accordance with the invention. The method 500 may be performed by the design system 400 of FIG. 4. The method 500 begins at step 502, where a module in a modular circuit design is selected. At step 504, a module definition for the module is obtained. At step 506, a logical implementation from the module definition is incorporated into a logical representation of the modular circuit design to logically define a module instance. Notably, the elements of the module instance (e.g., blocks and signals) are created by copying or grafting the elements (blocks and signals) within the logical implementation of the module definition. In one embodiment, a netlist from the module definition is incorporated into the hierarchy of a netlist for the modular circuit design.

At step 508, elements (blocks and signals) in the module instance are associated with equivalent elements (blocks and signals) in the module definition. Since the module instance is incorporated into the hierarchy of the modular circuit design, the elements of the module instance are associated with different identifiers than those associated with the elements in the module definition. The associations formed at step 508 are used during placement and routing of the module instance.

At step 510, routing templates and placement footprints are formed from a physical implementation in the module definition based on the associations formed at step 508. At step 512, the module instance is placed and routed using the routing templates and placement footprints formed at step 510 to identify matching resources. That is, the routing templates and placement footprints are used to re-locate the physical implementation of the module definition to implement the module instance using matching resources. Exemplary processes for forming placement footprints and routing templates and placing and routing module instances are described below. The process 500 may be repeated for each module instance in a given modular circuit design.

Figure 6:
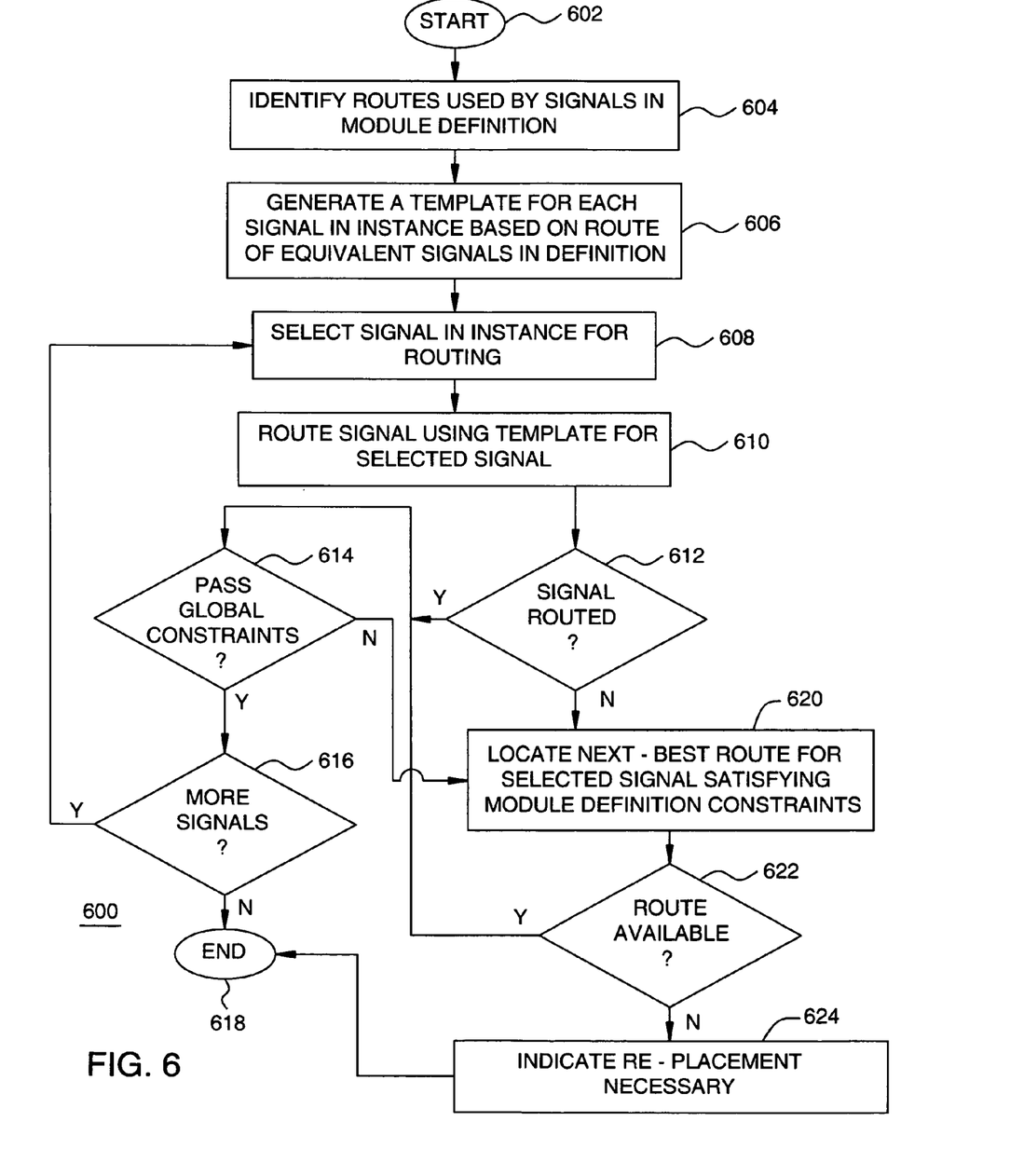
FIG. 6 is a flow diagram depicting an exemplary embodiment of a method for routing signals for a module instance in accordance with the invention.

FIG. 6 is a flow diagram depicting an exemplary embodiment of a method 600 for routing signals for a module instance in accordance with the invention. The method 600 begins at step 602. At step 604, routes used by signals in the module definition are identified. A signal includes at least one driver pin and at least one load pin. At step 606, a template for each signal in the module instance is generated based on the route of an equivalent signal in the module definition.

At step 608, a signal in the module instance is selected for routing. At step 610, the selected signal is routed using the corresponding template generated at step 606. Notably, the associated template may be decomposed into its constituent wires and switches. The selected signal may be routed by matching the wires and switches through either a top-down (drive pin to each load pin) or bottom-up (every load pin to drive pin) traversal. Since similar wires in similar tile types are equivalent in terms of their electrical characteristics, matching routing resources in the device may be found for the selected signal.

At step 612, a determination is made as to whether the selected signal was successfully routed. Notably, in some cases, routing resources may not be available to route the selected signal in exactly the same fashion as the equivalent signal in the module definition. This could be due to incorrect placement, or due to the module definition being implemented in a different device than the module instance. This could also be due to re-entrant routing or due to conflict with some other signal that is contending for the same routing resource (e.g., the routing resources may already be in use by another portion of the modular circuit design).

If the signal was not successfully routed, the method 600 proceeds to step 620. At step 620, the next-best route is located that satisfies the constraints in the module definition. In particular, the constraints may be annotated to determine whether there is any constraint that dictated the routing pattern of the selected signal. Based on the results of the evaluation, the selected signal may be routed using the next-best match, without sacrificing the performance or intent of the original routing for the signal in the module definition. Thus, the invention is capable of providing intelligent re-location of a signal in the module definition based on constraint resolution.

At step 622, a determination is made as to whether the next-best route is available. If so, the method 600 proceeds to step 614. Otherwise, the method 600 proceeds to step 624, where the method 600 indicates that re-placement of the module instance is necessary. In other words, the module instance was placed in a manner that prevents the selected signal from being routed as set forth by the module definition routing and constraints on such routing. The method 600 proceeds from step 624 to end step 618.

If at step 612 the signal was successfully routed, the method 600 proceeds to step 614. At step 614, a determination is made as to whether the signal route satisfies any global constraints set forth by the user. For example, while a signal route may satisfy the routing constraints of the module definition, the user may have set forth more rigorous constraints. If the signal route does not satisfy the global constraints, the method 600 proceeds to step 620 and proceeds as described above. Otherwise, the method 600 proceeds to step 616.

At step 616, a determination is made as to whether more signals are to be routed. If so, the process 600 returns to step 608 and repeats for another selected signal. Otherwise the method 600 proceeds to end step 620.

Figure 7:
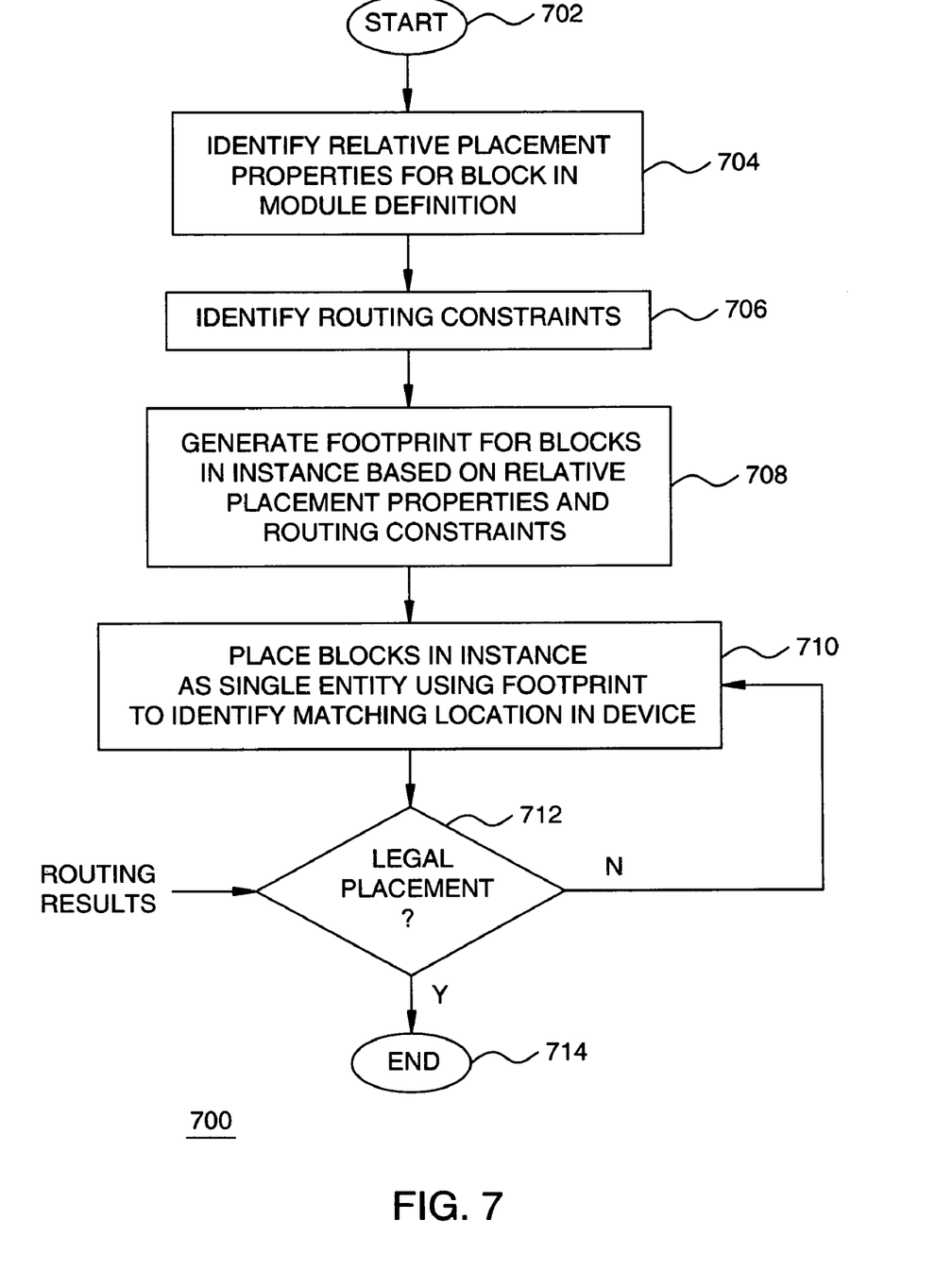
FIG. 7 is a flow diagram depicting an exemplary embodiment of a method for placing blocks of a module instance in accordance with the invention.

FIG. 7 is a flow diagram depicting an exemplary embodiment of a method 700 for placing blocks of a module instance in accordance with the invention. The method 700 begins at step 702. At step 704, relative placement properties for blocks in the module definition are identified. In one embodiment, a block in the module definition is selected as a reference block and offsets to the other blocks are extracted with respect to the reference block. At step 706, routing constraints are identified from the module definition. The routing constraints may place additional constraints on placement of the module instance, such as alignment restrictions.

At step 708, a footprint is generated for blocks in the module instance based on the relative placement properties and the identified routing constraints. At step 710, the blocks in the module instance are placed as a single entity using the footprint to identify a matching location in the target device. That is, the blocks of the module instance are placed in a similar location as the blocks of the pre-implemented module definition. For example, the blocks of the module instance may be placed using similar tile-types as the pre-implemented module definition.

At step 712, a determination is made as to whether the placement is legal. That is, the routing results may dictate that a new placement is necessary do to failure to route one or more signals. If the placement is not legal, the method 700 returns to step 710 and re-places the blocks in the module instance. Otherwise, the method 700 ends at step 714.

Figure 8:
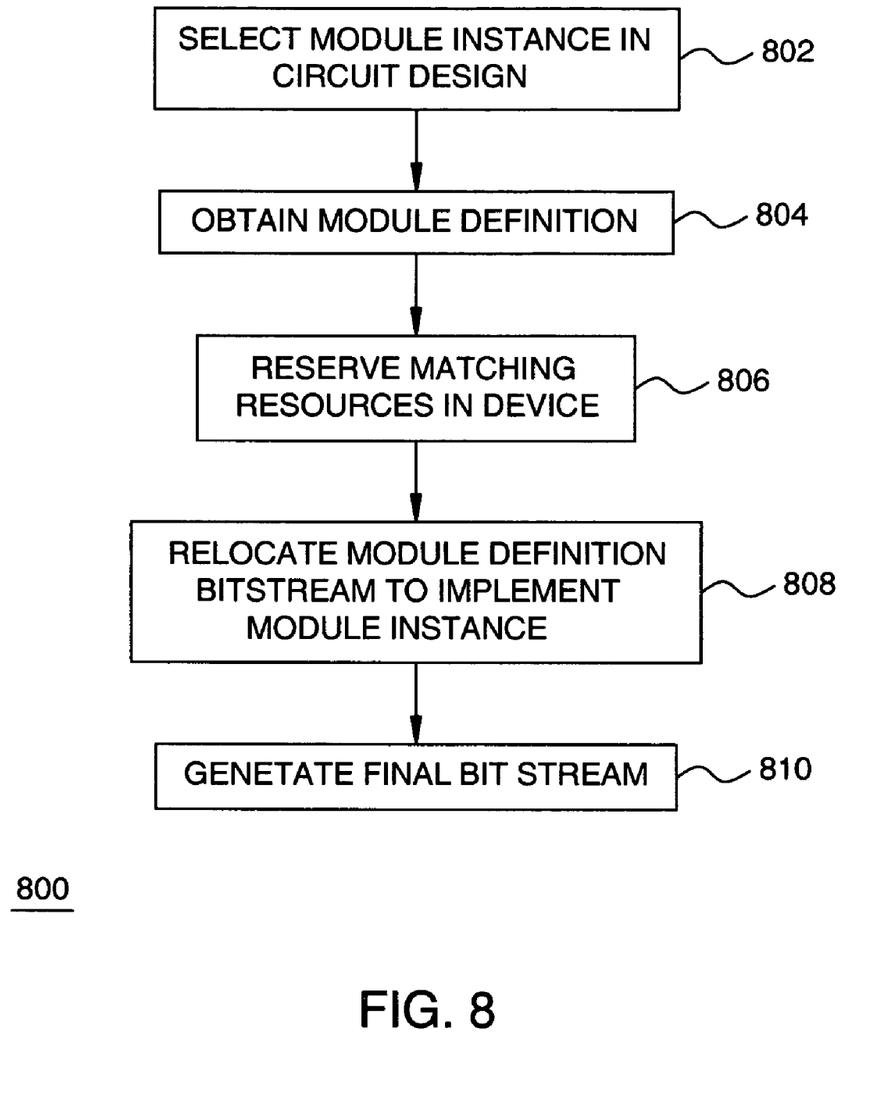
FIG. 8 is a flow diagram depicting another exemplary embodiment of a method for implementing a modular circuit design in accordance with the invention.

FIG. 8 is a flow diagram depicting another exemplary embodiment of a method 800 for implementing a modular circuit design in accordance with the invention. The method 800 may be performed by the design system 400 of FIG. 4. The method 800 begins at step 802, where a module in the modular circuit design is selected. At step 804, a module definition for the module is obtained. In the present embodiment, the physical implementation of the module definition comprises a bitstream for the target device. For example, the module definition may comprise an encrypted intellectual property (IP) core or secure core. The vendor of the module definition may pre-implement the module definition, but only provide a bitstream for the target device. The module definition essentially appears as a "black-box" to the user and the design flow tools.

At step 806, matching resources in the device are reserved. The design tools reserve matching resources in the device for implementing the black-box module. At step 808, a module definition bitstream is re-located for the target device to implement the module instance. In one embodiment, the module definition bitstream is used to generate a pattern for the SRAM memory cells in the configuration memory for the device. A final bitstream for the modular circuit design may be produced by applying the pattern to various instances of the module definition. At step 810, a final bitstream is generated for the modular circuit design.

Figure 9:
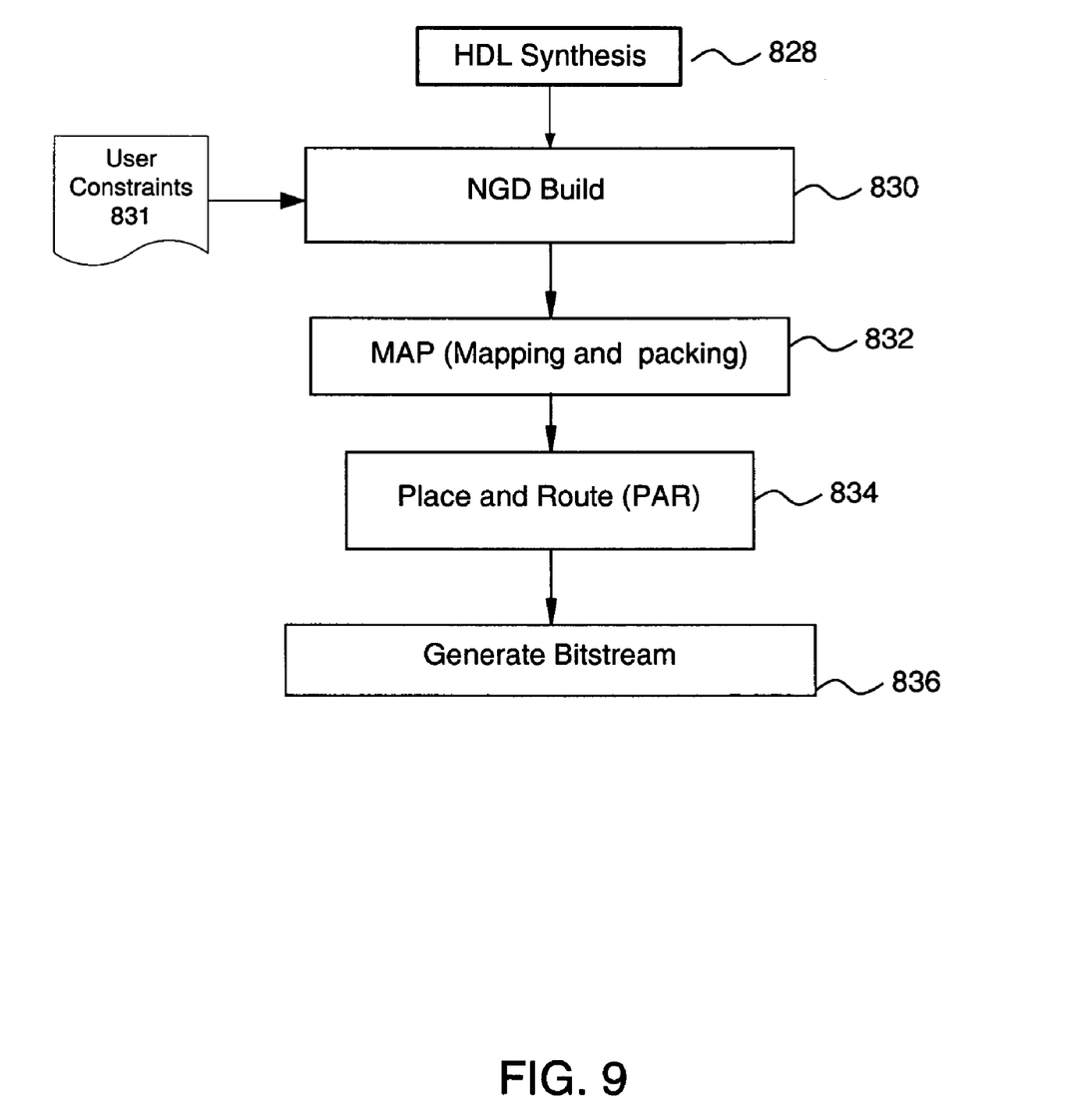
FIG. 9 illustrates a method for implementing a pre-implemented circuit design module, in accordance with an embodiment of the present invention.

FIG. 9 is a simplified design flow for programming an FPGA using a commercial implementation tool available from Xilinx, Inc., of San Jose Calif. At step 828 a Hardware Description Language (HDL) user design is synthesized into an EDIF netlist. At step 830 NGD build takes the EDIF netlist along with predetermined user specified design constraints 831 and converts them into a Xilinx netlist format called the NGD (Native Generic Database) file.

At step 832 MAP, which includes both mapping and packing, takes the NGD file, which contains both the hierarchical components used to develop the design, the lower-level Xilinx primitive elements, e.g., Look-up-tables (LUTs), Flip-flops, and any number of hard placed-and-routed macros and maps these items into a specific FPGA device. In addition the primitive elements are packed into FPGA components, e.g., CLBs and IOBs, for the specified FPGA device. Then this information is written to a NCD (Native Circuit Description) file. MAP also produces a list of the user specified design constraints in the PCF (Physical Constraints File)

At step 834 place and route (PAR) takes the NCD file from MAP and places the CLBs and IOBs at particular locations on the actual FPGA, then routes the connections between all the logic in the design; the result is saved in the NCD file.

At step 836 BitGen takes the placed and routed NCD file and converts it to a bitstream that can be used to program, i.e., configure, the FPGA.

Figure 10:
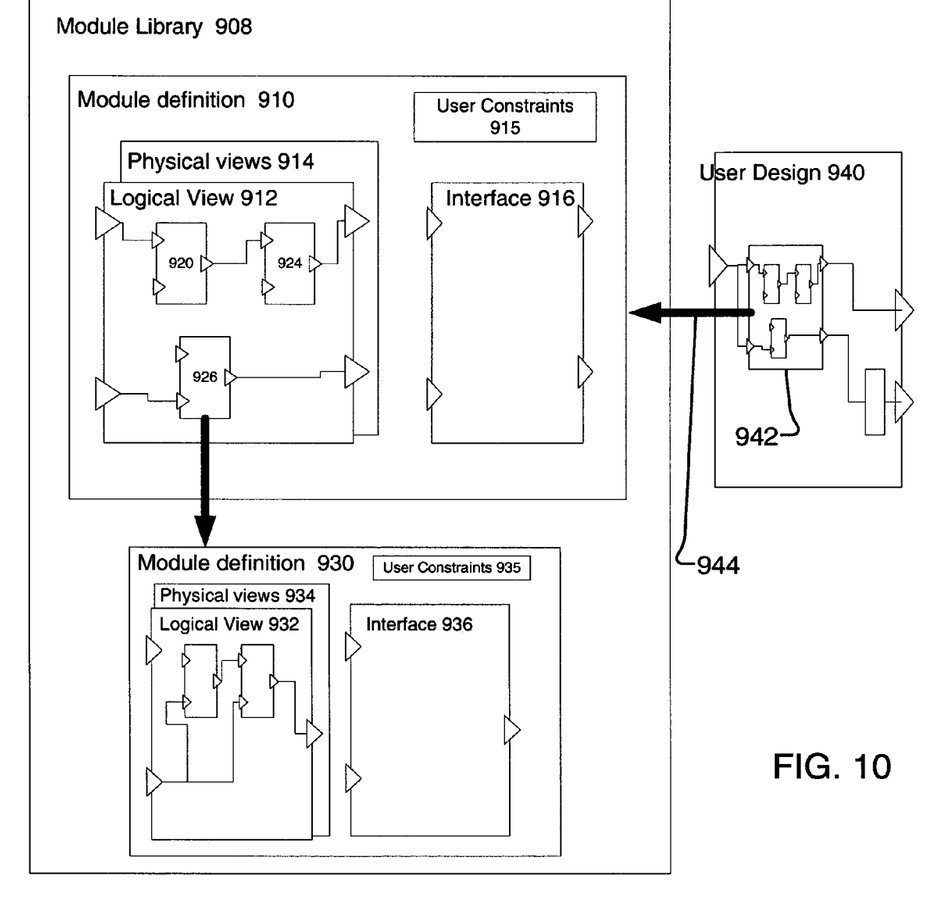
FIG. 10 illustrates a simplified block diagram of a module definition and module in accordance with an embodiment of the present invention.

Using FIG. 9 as a reference, a module definition is first created by the user creating an optional user's constraints file, a standalone module implementation and a module interface. An example of a module implementation is a hard coded HDL macro. This module implementation is the run through the design flow of FIG. 9 from synthesis (step 828) through bitstream (step 836). The multiple views, e.g., logical view and physical views, created along with the module interface form a module definition (see 910 in FIG. 10). The optional users' constraints file is either kept as a separate file or annotated into the module implementation and is illustrated by label 915 of FIG. 10. Hence some or all of the user's constraints can be reused in a different design. An example of some of the code that may be executed in creating the module definition is as follows:

```
Pds_PdlLibrary* ModuleLib = Pds_PdlLibrary::CreateLibrary(LibraryName, device information)
// Create a new type block for the macro interface
Pds_PdlBlock    *    moduleTypeBlock    =
    moduleLib→CreateTypeBlock(blockName);
// Create and save different views pertaining to different stages of the flow.
// For example after mapping there will be a logical view. Before packing there will be a frag-covered view. After packing there will be a comp level view.
// After synthesis: gatelevelview
Xdm_View* logicalview = moduleDesign→CreateView("logical");
logicalView→SaveView;
//After mapping to FPGA components.
Xdm_View*        FragCoveredView        =
    moduleDesign→CreateView("Frag-covered");
FragCoveredView→SaveView;
//After Packing into comps
Xdm_View* packedView = moduleDesign→CreateView("Packed");
packedView→SaveView;
//After PAR: placement and routing
packedView→SaveView;
```

FIG. 10 is a simplified block diagram of a module definition and module instance of embodiment of the present invention. In a module library 908 which may have one or more files or be part of a database, one or more module definitions are stored. An example module definition is parent module definition 910 having a child module definition 930. Module definition 910 has the one or more views 912 and 914 of the module implementation after it has be run through the design flow of FIG. 9 (as described previously) and the module interface 916 (i.e., the black box view). One of the multiple views may be the logical view 912 (i.e., gate level view), which looks like a circuit schematic having, for example, component 926 and component 920 coupled to 924. One physical view 914 is the frag view, which shows the result of the mapping of the gate level elements to the FPGA components, e.g., CLBs and IOBs. Another physical view 914 is the packed view, which shows, for example, the packing of gates into CLBs.

As FIG. 10 illustrates the module definitions may be hierarchical. For example, module definition 910 has sub-module 926, which has module definition 930. Module definition 930 has like module definition 910, a logical view 932, physical views 934, user constraints 935, and interface 936.

Once there is a module library 908 having one or more module definitions, e.g., 914 and 930, representing one or more modules, the next step is to reuse these modules in another user design. The first step is to instantiate the module definition, e.g., 910, in the another user design 940, e.g., module instantiation 942. An example of the code that performs the module instantiation is as follows:

```
const Pds_PdlLibrary * moduleLib = Pds_PdlLibrary::
    LoadLibraryFile(moduleFilePath);
// Create an instance of the macro definition.
// Set includeHier = true to graft the macro definition hierarchy onto the module instance. If false then the module instance will appear as a black box.
bool includeHier = true;
Xdm_Block        *        moduleInst        =
    moduleInstParentBlock→CreateTypedBlock(moduleInstName, moduleTypeBlock, includeHier);
```

The next step is to implement the module instance as per module definition. For example, once a hard macro is instantiated in a user's design, the implementation tools must implement it, for example by placing and routing its contents. If the module definition had implementation data (i.e., placement and routing), the implementation tools use that data as a template to "guide" the implementation of the module instance. For example, if the module definition was fully placed and routed, the Router needs to extract the routing from the module definition and use that as a template for routing the nets in the module instance. Hence by tying the module instance 942 back to its module definition 910 as illustrated by the arrow 944, some or all of the previously developed implementation data may be re-used or used as a guide. An example of the code that implements the module instance as per module definition is as follows:

```
//Logical Implementation: Cut and Paste of hierarchy underneath the module from the definition and applying correlation properties from module instance elements (such as blocks and nets) to their respective elements in the module definition.
```

```
Xdh_GraftManager→GraftHierarchy (moduleInst, modu-
    leTypeBlock);
Xdh_CorrelationManager→AttachCorrelationProperties
    (moduleInst, moduleTypeBlock);
//Physical Implementation
// From the module definition implementation, extract rela-
    tive placement properties for all the blocks in the module
    definition.
RelocationHelper→ExtractRelativePlacementInfoFor
    ModuleDefinition(moduleDefinition)
{
    //First determine a reference block and then compute
        relative offsets of other blocks to it.
    //The ref block will be normalized to the origin (0,0).
    Xdm_Block*          RefBlock            =
        RelocationHelper→FindReferenceBlock (module-
        Definition);
    //Loop through all blocks and find their offsets w.r.t
        reference block.
    for (all blocks in module definition)
    {
        StoreOffsets ( );
    }
}
//Loop through ModuleInstances from the design and
    attach relative placement properties for the blocks as per
    the module definition
for (all module instances in the design)
{
    for each (moduleInst)
    {
        AttachRelativePlacementPropertiestotheBlocks  (
            moduleInst);
    }
}
// Similarly correlate the nets between in module instances
    and create routing templates. Routing of a net is a set of
    wires and arcs.
// During Placement, also check if routing succeeds. The
    Routing of a net using template works like the following.
PatternRoute (InstNet, Template_Created_FromDefini-
    tionNet)
{
    //Do a depth first or breadth first walk of the net and the
        Template.
    //Look at the Tile, wire and the arc for the driven node in
        Template.
    // From the InstNet node, get the corresponding arc in the
        Placed Tile
    Rf_Arc              ArcToBeAdded        =
        Device→GetCorrespondingArc(TemplateNode,
        TemplateArc, TargetNode);
    InstNet→AddArc(ArcToBeAdded);
}
```

A hard coded macro (i.e., hard macro) is an example of a module described in FIG. 10. An embodiment of the present invention includes a method for generating a hard macro definition and instantiating a hard macro in a user design having the steps of:

1. The user creates a hard macro. The hard macro is saved in an nmc file.
2. The user references the hard macro in his logical design (netlist or HDL)
3. Ngd build recognizes the reference as a hard macro by matching the cell type to an .nmc file using its search path. Ngd build requests PhysSimExpander to read the nmc file and create a simulation model that represents the hard macro. Ngd build grafts the simulation model below the hard macro blackbox block. It attaches the .nmc file path to the macro instance and tags the blackbox as a simulation model so that its child hierarchy isn't processed by Map or Pack.
4. Map processes the logical design and sees the special tags on the macro instance so it treats the macro instance as a blackbox
5. Packer recognizes the blackbox as a hard macro instance from the tags left by Ngd build. It uses the filepath attached to the blackbox by Ngd build to locate the nmc file. It opens the nmc file and reads the macro definition. It creates a macro definition in the local design, and creates a macro instance that references the macro definition. There may be one or more macro instances that reference the same macro definition.
6. Physical tools such as Place and Route operate on the hard macro instance.
7. When the design is completely implemented, Bitgen operates on the hard macro instance to generate a bitstream.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of implementing a pre-implemented circuit design for a programmable logic device, comprising:
   obtaining a definition of said pre-implemented circuit design, said definition including a first physical implementation and a first logical implementation;
   producing a second physical implementation and a second logical implementation for an instance of said pre-implemented circuit design using said first physical implementation and said first logical implementation;
   wherein said pre-implemented circuit design comprises a plurality of configurable elements of said programmable logic device; and
   wherein said producing comprises:
      incorporating said first logical implementation into a logic design to define said second logical implementation for said instance of said pre-implemented circuit design;
      forming associations between elements in said instance with equivalent elements in said first logical implementation;
      forming routing template data in response to said first physical implementation and said associations
      forming placement footprint data in response to said first physical implementation and said associations; and
      generating said second physical implementation using said routing template data and said placement footprint data.

2. The method of claim 1, wherein said step of generating, comprises:
   placing blocks defining said instance using said placement footprint data; and
   routing signals defining said instance using said routing template data.

3. The method of claim 2, wherein said definition further includes constraint data, and wherein said method further comprises:

verifying routing of said signals defining said instance to identify un-routed signals; and routing said un-routed signals using said routing template data and said constraint data to identify a next-best route.

4. The method of claim 1, wherein said step of forming placement footprint data comprises:

identifying relative placement properties associated with blocks in said first logical implementation; and generating said placement footprint data for blocks defining said instance based on said relative placement properties.

5. The method of claim 1, wherein said first logical implementation comprises a netlist, and wherein said first physical implementation comprises an implementation of said netlist.

6. The method of claim 1, wherein said first physical implementation comprises a bitstream for said programmable logic device.

7. The method of claim 6, further comprising:

reserving resources in said programmable logic device; and relocating said bitstream to produce said second physical implementation.

8. An apparatus for implementing a pre-implemented circuit design for a programmable logic device, comprising:

means for obtaining a definition of said pre-implemented circuit design, said definition including a first physical implementation and a first logical implementation;

means for producing a second physical implementation and a second logical implementation for an instance of said pre-implemented circuit design using said first physical implementation and said first logical implementation, wherein said pre-implemented circuit design comprises a plurality of configurable elements of said programmable logic device; and, wherein said means for producing comprises:

means for incorporating said first logical implementation into a logic design to define said second logical implementation for said instance of said pre-implemented circuit design;

means for forming associations between elements in said instance with equivalent elements in said first logical implementation;

means for forming routing template data in response to said first physical implementation and said associations;

means for forming placement footprint data in response to said first physical implementation and said associations; and means for generating said second physical implementation using said routing template data and said placement footprint data.

9. The apparatus of claim 8, wherein said means for generating, comprises:

means for placing blocks defining said instance using said placement footprint data; and means for routing signals defining said instance using said routing template data.

10. The apparatus of claim 9, wherein said definition further includes constraint data, and wherein said apparatus further comprises:

means for verifying routing of said signals defining said instance to identify un-routed signals; and means for routing said un-routed signals using said routing template data and said constraint data to identify a next-best route.

11. The apparatus of claim 8, wherein said means for forming placement footprint data comprises:

means for identifying relative placement properties associated with blocks in said first logical implementation; and means for generating said placement footprint data for blocks defining said instance based on said relative placement properties.

12. The apparatus of claim 8, wherein said first logical implementation comprises a netlist, and wherein said first physical implementation comprises an implementation of said netlist.

13. The apparatus of claim 8, wherein said first physical implementation comprises a bitstream for said programmable logic device.

14. The apparatus of claim 13, further comprising:

means for reserving resources in said programmable logic device; and means for relocating said bitstream to produce said second physical implementation.

15. A system for implementing a circuit design, comprising:

a database for storing a definition of a pre-implemented circuit design for a programmable logic device, said definition including a first physical implementation and a first logical implementation;

a synthesis tool for producing a second logical implementation for an instance of said pre-implemented circuit design using said first logical implementation;

an implementation tool for producing a second physical implementation for said instance of said pre-implemented circuit design using said first physical implementation;

wherein said pre-implemented circuit design comprises a plurality of configurable elements of said programmable logic device; and wherein said producing comprises:

incorporating said first logical implementation into a logic design to define said second logical implementation for said instance of said pre-implemented circuit design;

forming associations between elements in said instance with equivalent elements in said first logical implementation;

forming routing template data in response to said first physical implementation and said associations;

forming placement footprint data in response to said first physical implementation and said associations; and generating said second physical implementation using said routing template data and said placement footprint data.

16. The system of claim 15, wherein said database is configured to store at least one additional definition for a respective at least one additional pre-implemented circuit.

17. The system of claim 15, wherein said definition further includes constraint data.

18. The system of claim 15, wherein said first logical implementation comprises a netlist, and wherein said first physical implementation comprises an implementation of said netlist.

19. The system of claim 15, wherein said first physical implementation comprises a bitstream for said programmable logic device.

* * * * *